(12) United States Patent
Inoue et al.

(10) Patent No.: US 10,717,670 B2
(45) Date of Patent: Jul. 21, 2020

(54) GLASS FOR LASER PROCESSING AND METHOD FOR PRODUCING PERFORATED GLASS USING SAME

(71) Applicant: Nippon Sheet Glass Company, Limited, Tokyo (JP)

(72) Inventors: Teruhide Inoue, Kanagawa (JP); Junji Kurachi, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 152 days.

(21) Appl. No.: 15/549,939

(22) PCT Filed: Feb. 3, 2016

(86) PCT No.: PCT/JP2016/000570
§ 371 (c)(1),
(2) Date: Aug. 9, 2017

(87) PCT Pub. No.: WO2016/129254
PCT Pub. Date: Aug. 18, 2016

(65) Prior Publication Data
US 2018/0029924 A1 Feb. 1, 2018

(30) Foreign Application Priority Data

Feb. 10, 2015 (JP) ................................ 2015-024343

(51) Int. Cl.
| | | |
|---|---|---|
| *C03C 3/093* | (2006.01) | |
| *C03C 3/095* | (2006.01) | |
| *C03C 4/00* | (2006.01) | |
| *B23K 26/352* | (2014.01) | |
| *B23K 26/53* | (2014.01) | |
| *C03C 23/00* | (2006.01) | |
| *B23K 26/70* | (2014.01) | |
| *B23K 26/00* | (2014.01) | |
| *B23K 26/06* | (2014.01) | |
| *C03B 33/02* | (2006.01) | |
| *C03C 3/091* | (2006.01) | |
| *C03C 15/00* | (2006.01) | |
| *B23K 103/00* | (2006.01) | |

(52) U.S. Cl.
CPC .......... *C03C 3/093* (2013.01); *B23K 26/0006* (2013.01); *B23K 26/0648* (2013.01); *B23K 26/352* (2015.10); *B23K 26/53* (2015.10); *B23K 26/70* (2015.10); *C03B 33/0222* (2013.01); *C03C 3/091* (2013.01); *C03C 3/095* (2013.01); *C03C 4/0071* (2013.01); *C03C 15/00* (2013.01); *C03C 23/0025* (2013.01); *B23K 2103/54* (2018.08)

(58) Field of Classification Search
CPC ......... C03C 3/091; C03C 3/093; C03C 3/095; C03C 3/097; C03C 4/0071
See application file for complete search history.

(56) References Cited

U.S. PATENT DOCUMENTS

| | | | |
|---|---|---|---|
| 6,096,670 | A | 8/2000 | Lautenschlager et al. |
| 6,329,310 | B1 * | 12/2001 | Peuchert ................. C03C 3/091 501/64 |
| 6,417,124 | B1 * | 7/2002 | Peuchert ................. C03C 3/091 313/493 |
| 2002/0151426 | A1 | 10/2002 | Murata et al. |
| 2006/0094584 | A1 | 5/2006 | Shojiya et al. |
| 2007/0158317 | A1 * | 7/2007 | Brix ...................... C03B 33/091 219/121.72 |
| 2009/0226671 | A1 * | 9/2009 | Yanase .................. C03B 17/064 428/156 |
| 2015/0315065 | A1 * | 11/2015 | Miwa ..................... C03C 3/091 501/67 |
| 2016/0060156 | A1 | 3/2016 | Krueger et al. |
| 2016/0368815 | A1 * | 12/2016 | Hayashi .............. C03C 10/0036 |

FOREIGN PATENT DOCUMENTS

| | | |
|---|---|---|
| CN | 1460091 | 12/2003 |
| JP | H11157869 | 6/1999 |
| JP | 2000302475 | 10/2000 |
| JP | 2001076336 A | 3/2001 |
| JP | 2001261366 A * | 9/2001 |
| JP | 2001261366 A | 9/2001 |
| JP | 2004137145 | 5/2004 |
| JP | 2005093422 | 4/2005 |
| JP | 2007256764 | 10/2007 |
| JP | 2010024064 A | 2/2010 |
| JP | 4495675 B2 | 7/2010 |
| JP | 2010248046 | 11/2010 |
| JP | 4672689 B2 | 4/2011 |
| WO | 2012132328 A1 | 10/2012 |
| WO | 2014161535 | 10/2014 |

OTHER PUBLICATIONS

WO2012/132328 Google Patents Machine Translation, Performed Sun, Kuan-Han, "Fundamental Condition of Glass Formation," Journal of The American Ceramic Society, 1947, vol. 30, No. 9, pp. 277-281.
International Search Report for PCT/JP2016/000570, dated Apr. 12, 2016, 5 pages including English translation. May 3, 2019, 14 pages. (Year: 2019).*

* cited by examiner

*Primary Examiner* — Elizabeth A. Bolden
(74) *Attorney, Agent, or Firm* — Hamre, Schumann, Mueller & Larson, P.C.

(57) ABSTRACT

The present invention provides a glass composition that allows holes with a circular contour and a smooth inner wall to be formed by a collective micro-hole-forming process using a combination of modified portion formation by ultraviolet laser irradiation and etching, the glass composition being adapted for practical continuous production. The present invention relates to a glass for laser processing, the glass including a metal oxide serving as a coloring component, the glass having a glass composition including, in mol %: $45.0\% \leq SiO_2 \leq 68.0\%$; $2.0\% \leq B_2O_3 \leq 20.0\%$; $3.0\% \leq Al_2O_3 \leq 20.0\%$; $0.1\% \leq TiO_2 \leq 5.0\%$; and $0\% \leq ZnO \leq 9.0\%$, wherein a relationship of $0 \leq Li_2O + Na_2O + K_2O < 2.0\%$ is satisfied.

15 Claims, 2 Drawing Sheets

GLASS FOR LASER PROCESSING AND METHOD FOR PRODUCING PERFORATED GLASS USING SAME

TECHNICAL FIELD

The present invention relates to a glass for laser processing and a method for producing a perforated glass using the glass for laser processing.

BACKGROUND ART

Components having an array of a large number of minute through holes are used as microscopic elements for MEMS or electronic devices. As such components there are generally used silicon wafers whose expansion and contraction due to temperature change is small (CTE=around $35 \times 10^{-7}/°$C.) and which are thus resistant to breakage. Silicon wafers, which have a low coefficient of thermal expansion (CTE), are also characterized by undergoing little change in properties in response to temperature change. However, production of monocrystalline silicon, which is a main material of silicon wafers, requires very high cost, so that silicon wafers are also very expensive. Furthermore, laser processing employing ablation, which is a practically used technique for forming holes in silicon wafers, necessarily involves applying a plurality of laser pulses to form one hole and has difficulty in achieving high-speed processing. That is, such laser processing employing ablation requires a long tact time and hence a high processing cost.

A technique is known that uses a combination of ultraviolet laser pulse irradiation and wet etching and that theoretically enables high-speed hole forming by which 1000 or more holes can be formed per second (Patent Literature 1). In this processing method, pulsed laser beams having a wavelength of 535 nm or less are focused by a specific lens, and a sheet of glass, in which holes are to be formed, is irradiated with the focused laser beams to form modified portions in the glass. The glass having the modified portions formed therein is immersed in hydrofluoric acid to form through holes or blind holes in the modified portions; this hole formation takes advantage of the fact that the modified portions are etched at a higher rate than the rest of the glass.

According to Patent Literature 1, collective and simultaneous formation of cylindrical or frustoconical through holes is achieved in a titanium-containing silicate glass as described in Example 1, 12, or the like. However, the composition of the glass disclosed in the examples includes such a large amount of alkali metal in the form of oxide that the glass has a higher coefficient of thermal expansion than silicon wafers and is unsuitable for use in MEMS or electronic devices. In addition, the glass contains a high concentration of titanium which is known as a component that can promote devitrification as a core former. The glass is thus prone to devitrification, which is disadvantageous for continuous production. Furthermore, an alkali component contained in the composition can contaminate device production lines.

CITATION LIST

Patent Literature

Patent Literature 1: JP 4672689 B2

SUMMARY OF INVENTION

Technical Problem

The present invention aims to provide a glass that allows holes with a circular contour and a smooth inner wall to be formed therein by a collective micro-hole-forming process using a combination of modified portion formation by ultraviolet laser irradiation and etching, the glass being adapted for practical continuous production.

Solution to Problem

The present inventors have found for the first time that using a metal oxide containing Fe, Ce, or the like as a coloring component together with Ti in a glass can lead to high quality of holes formed in the glass even when satisfactory hole quality cannot be achieved merely by incorporating Ti alone.

The present invention provides a glass for laser processing, the glass including a metal oxide serving as a coloring component, the glass having a glass composition including, in mol %:

45.0%≤$SiO_2$≤68.0%;
2.0%≤$B_2O_3$≤20.0%;
3.0%≤$Al_2O_3$≤20.0%;
0.1%≤$TiO_2$≤5.0%; and
0%≤ZnO≤9.0%,
wherein a relationship of 0≤$Li_2O+Na_2O+K_2O$<2.0% is satisfied.

The present invention also provides a method for producing a perforated glass, the method including the steps of [i] irradiating an area of the above glass for laser processing with a specific laser pulse focused by a lens, thereby forming a modified portion in the irradiated area; and [ii] etching at least the modified portion using an etchant.

Advantageous Effects of Invention

With the use of the glass for laser processing according to the present invention, a glass having holes with a circular contour and a smooth inner wall can be produced by a collective micro-hole-forming process using a combination of modified portion formation by ultraviolet laser irradiation and etching. In addition, the glass according to the present invention, when subjected to a specific hole forming process, can resist damage such as cracks which may occur around the processed portions. Thus, it is possible to obtain a glass having holes which are uniform in the glass surface. The present invention allows the use of a nanosecond Nd:YVO laser that emits harmonic beams, thus eliminating the need to use a femtosecond laser which is generally expensive. The present invention is therefore industrially advantageous. In addition, the glass according to the present invention can be suitably used in the form of an alkali-free glass substrate for use as a component of a display device such as a display screen or touch panel without being subjected to any processing such as hole forming when the glass meets the requirements as to optical properties such as transmittance properties.

DESCRIPTION OF EMBODIMENTS

Figure 1:
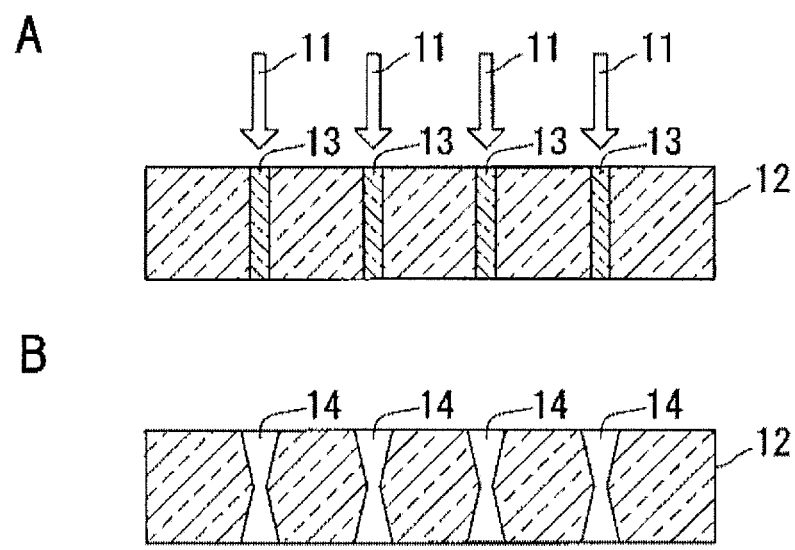
FIG. 1 is a schematic diagram illustrating the production method of the present invention.

The glass for laser processing according to the present invention is characterized in that the glass includes a metal oxide serving as a coloring component, that the glass has a glass composition including, in mol %, $45.0\% \leq SiO_2 \leq 68.0\%$, $2.0\% \leq B_2O_3 \leq 20.0\%$, $3.0\% \leq Al_2O_3 \leq 20.0\%$, $0.1\% \leq TiO_2 \leq 5.0\%$, and $0\% \leq ZnO \leq 9.0\%$, and that a relationship of $0 \leq Li_2O+Na_2O+K_2O<2.0\%$ is satisfied.

The average coefficient of thermal expansion in the temperature range of 50 to 350° C. (which may be simply referred to herein as "coefficient of thermal expansion") of the glass for laser processing according to the present invention is preferably $70\times10^{-7}$/° C. or less, more preferably $60\times10^{-7}$/° C. or less, even more preferably $50\times10^{-7}$/° C. or less, and particularly preferably $45\times10^{-7}$/° C. or less. The lower limit of the coefficient of thermal expansion is not particularly defined, and the coefficient of thermal expansion may be, for example, $10\times10^{-7}$/° C. or more or may be $20\times10^{-7}$/° C. or more. The coefficient of thermal expansion is measured as follows. First, a cylindrical glass sample having a diameter of 5 mm and a height of 18 mm is prepared. This glass sample is heated from 25° C. up to the yield point of the glass sample, the elongation of the glass sample is measured at various temperatures, and the coefficient of thermal expansion is calculated on the basis of the elongation. The average of values of the coefficient of thermal expansion in the temperature range of 50 to 350° C. is calculated to determine the average coefficient of thermal expansion. The actual measurement of the coefficient of thermal expansion was carried out at a temperature rise rate of 5° C./min using TMA 4000 SA, a thermomechanical analyzer manufactured by NETZSCH Japan K.K.

The absorption coefficient α of the glass for laser processing according to the present invention is preferably 1 to 50/cm and more preferably 3 to 40/cm. The absorption coefficient may be adjusted, over the entire thickness of the glass, to a value necessary for forming modified portions. If the absorption coefficient α is more than 50/cm, the laser absorption is so strong that most of the laser energy is absorbed in the vicinity of the laser-incident side of the glass. Consequently, the energy fails to reach the vicinity of the opposite side, and a modified portion penetrating through the glass cannot be formed. If the absorption is excessively weak, the laser beam passes through the glass without causing any effect; namely, the glass fails to absorb the laser energy, so that no modified portion can be formed.

The absorption coefficient α can be calculated by measuring the transmittance and reflectance of a glass substrate having a thickness of t (cm). For the glass substrate having a thickness of t (cm), the transmittance T (%) and the reflectance R (%) at an incident angle of 12° are measured at a predetermined wavelength (wavelength of 535 nm or less) using a spectrophotometer (such as V-670, an ultraviolet/visible/near-infrared spectrophotometer manufactured by JASCO Corporation). The absorption coefficient α is calculated from the measured values using the following equation.

$$\alpha = (1/t) * \ln\{(100-R)/T\}$$

Various components that may be contained in the glass for laser processing according to the present invention will be described hereinafter. The upper and lower limits of value ranges (such as the ranges of the contents of the components, the ranges of values calculated for the components, and the ranges of values of various properties) described herein can be combined as appropriate.

(1) $SiO_2$ $SiO_2$ is a network-forming oxide constituting a main glass network. The incorporation of $SiO_2$ contributes to an increase in chemical durability and also allows for adjustment of the temperature-viscosity relationship and adjustment of the devitrification temperature. If the $SiO_2$ content is excessively high, melting at temperatures lower than 1700° C. which are practical is difficult, while if the $SiO_2$ content is excessively low, the liquidus temperature at which devitrification occurs is lowered. In the glass of the present invention, the $SiO_2$ content is 45.0 mol % or more, preferably 50.0 mol % or more, more preferably 52.0 mol % or more, and even more preferably 55.0 mol % or more. The $SiO_2$ content is 68.0 mol % or less, preferably 66.0 mol % or less, more preferably 65.0 mol % or less, and even more preferably 63.0 mol % or less.

(2) $B_2O_3$ $B_2O_3$ is a network-forming oxide constituting a main glass network, similarly to $SiO_2$. The incorporation of $B_2O_3$ allows a glass to have a lowered liquidus temperature and hence a practical melting temperature. If an alkali-free or low-alkali glass having a relatively high $SiO_2$ content has an excessively low $B_2O_3$ content, melting of the glass at temperatures lower than 1700° C. which are practical is difficult. If the $B_2O_3$ content is excessively high, the amount of $B_2O_3$ evaporated during high-temperature melting is increased so that stable maintenance of the compositional ratio is difficult. The $B_2O_3$ content is 2.0 to 20.0 mol %. If the $B_2O_3$ content is less than 7.0 mol %, the glass has an increased viscosity and becomes more difficult to melt, while if the $B_2O_3$ content is more than 17.0 mol %, the strain point of the glass is lowered. Thus, the $B_2O_3$ content is preferably 7.0 mol % or more, more preferably 7.5 mol % or more, and even more preferably 9.5 mol % or more. The $B_2O_3$ content is preferably 17.0 mol % or less, more preferably 15.0 mol % or less, and even more preferably 12.0 mol % or less.

(3) $SiO_2+B_2O_3$

If the total content of these network-forming components ($SiO_2+B_2O_3$) is more than 80.0 mol %, melting of the glass is considerably difficult. Thus, the total content of the network-forming components is preferably 80.0 mol % or less, more preferably 76.0 mol % or less, even more preferably 74.0 mol % or less, and particularly preferably 72.0 mol % or less. The total content of the network-forming components is preferably 55.0 mol % or more, more preferably 58.0 mol % or more, even more preferably 59.0 mol % or more, and particularly preferably 62.0 mol % or more.

(4) $Al_2O_3$ $Al_2O_3$ is a so-called intermediate oxide that may function as a network-forming oxide or as a modifying oxide depending on the balance between the content of the above network-forming components, $SiO_2$ and $B_2O_3$, and the content of the alkaline-earth metal oxides described below as modifying oxides. $Al_2O_3$ is in a tetracoordinated state in glasses and acts as a component that stabilizes glasses, prevents phase separation of borosilicate glasses, or provides an increase in chemical durability. If an alkali-free or low-alkali glass having a relatively high $SiO_2$ content has an excessively low $Al_2O_3$ content, melting of the glass at temperatures lower than 1700° C. which are practical is difficult. If the $Al_2O_3$ content is excessively high, the glass melting temperature is increased, and stable glass formation is difficult. The $Al_2O_3$ content is 3.0 to 20.0 mol %. If the $Al_2O_3$ content is less than 6.0 mol %, the strain point may be lowered, while if the $Al_2O_3$ content is more than 17.0 mol %, the glass surface is likely to be cloudy. Thus, the $Al_2O_3$ content is preferably 6.0 mol % or more, more preferably 6.5 mol % or more, even more preferably 7.0 mol % or more, and particularly preferably 7.5 mol % or more. The $Al_2O_3$ content is preferably 17.0 mol % or less, more preferably 15.0 mol % or less, even more preferably 13.0 mol % or less, and particularly preferably 11.0 mol % or less.

(5) $TiO_2$

JP 4495675 B2 describes a composition of a glass that can be relatively easily laser-processed without cracking, and states that weak bonds such as Na—O bond, which are formed by network-modifying oxides (such as alkali metal oxides, alkaline-earth metal oxides, and transition metal oxides), are not responsible for the ease of laser processing, and that the ease of laser processing is associated with the strength of bonds other than the weak bonds such as Na—O bond which are formed by the network-modifying oxides, namely, the strength of bonds formed by network-forming oxides and intermediate oxides. For this case, it can be thought that the intermediate oxides are introduced in the composition of the glass in sufficient amounts to allow complete bond breakage by the energy of the laser applied to the glass.

The present invention does not require direct physical processing, namely complete bond breakage, by laser ablation, and is characterized by endowing the glass with bonds having an appropriately weak strength that allows modified portions to be formed by laser irradiation energy. Among oxides classified as intermediate oxides according to the single bond strength-based glass-forming ability classification proposed by Kuan-Han Sun (J. Amer. Ceram. Soc. vol. 30, 9, Sep. 1947, pp. 277-281), $TiO_2$ is inferred to be involved in the modified portion formation by laser irradiation energy.

$TiO_2$ is an intermediate oxide as described above. It is known that, in glass processing by laser ablation, incorporation of $TiO_2$ in the glass to be processed can lower the laser processing threshold (JP 4495675 B2). It has also been found that, in a method for producing a perforated glass by a combination of laser irradiation and etching, incorporation of an appropriate amount of $TiO_2$ in an alkali-free or low-alkali glass having a specific composition allows formation of modified portions by irradiation with a relatively low-energy laser and facilitates removal of the modified portions by the subsequent etching.

$TiO_2$ is known to have a binding energy approximately equal to the energy of ultraviolet light and absorb ultraviolet light. Furthermore, when an appropriate amount of $TiO_2$ is incorporated in a glass, the coloring of the glass can be controlled by making use of interaction between coloring components described later and $TiO_2$; this interaction is generally known as charge-transfer absorption. Thus, adjusting the $TiO_2$ content can control absorption of certain light to a desired level. It is preferable to incorporate an appropriate amount of $TiO_2$ in a glass, since modified portions in which holes are to be formed by the etching step can easily be formed in the glass when the glass has an appropriate absorption coefficient. However, if the $TiO_2$ content is excessively high, the chemical resistance, in particular the resistance to hydrofluoric acid, is so excessively increased that, for example, the etching step subsequent to laser irradiation may fail to form desired holes. In addition, incorporation of an excess amount of $TiO_2$ in the glass leads to a high degree of coloring which may make the glass unsuitable for formation into a glass for use in display devices such as display screens. In the glass of the present invention, the $TiO_2$ content is practically adjusted to 0.1 mol % or more and less than 5.0 mol % based on the assumption of the combined use of $TiO_2$ and a coloring component described below which is selected from oxides of metals such as Ce, Fe, and Cu. To achieve good smoothness of inner walls of holes to be formed through laser irradiation, the $TiO_2$ content is preferably 0.2 to 4.0 mol %, more preferably 0.5 to 3.5 mol %, and even more preferably 1.0 to 3.5 mol %. When the coloring component described below and $TiO_2$ are used in combination, an excess amount of $TiO_2$ increases the absorption coefficient so that the laser energy is absorbed in the vicinity of the glass surface, which makes it difficult to form modified portions that are long in the thickness direction of the glass are formed. This may result in a failure to form through holes or holes which are nearly as long as through holes.

(6) ZnO

ZnO is a component that can act as an intermediate oxide and shows absorption in the ultraviolet region, similarly to $TiO_2$. Thus, ZnO provides beneficial effects when incorporated in the glass of the present invention. However, the glass of the present invention may be substantially free of ZnO (which means that the ZnO content is less than 0.1 mol %, preferably less than 0.05 mol %, and more preferably 0.01 mol % or less). In the glass of the present invention, the ZnO content is adjusted to 0 to 9.0 mol % based on the assumption of the combined use of $TiO_2$ and a coloring component described below which is selected from oxides of metals such as Ce, Fe, and Cu. The ZnO content is preferably 1.0 to 8.0 mol %, more preferably 1.5 to 5.0 mol %, and even more preferably 1.5 to 3.5 mol %.

(7) MgO

MgO is an alkaline-earth metal oxide which may be incorporated in the glass, since MgO is characterized by suppressing the increase in coefficient of thermal expansion without causing a significant decrease in strain point and also provides an improvement in meltability. However, it is not preferable that the MgO content be excessively high, because in this case the glass may undergo phase separation or may have poor devitrification resistance and low acid resistance. In the glass of the present invention, the MgO content is preferably 15.0 mol % or less, more preferably 12.0 mol % or less, even more preferably 10.0 mol % or less, and particularly preferably 9.5 mol % or less. The MgO content is preferably 2.0 mol % or more, more preferably 3.0 mol % or more, even more preferably 4.0 mol % or more, and particularly preferably 4.5 mol % or more.

(8) CaO

CaO may be incorporated in the glass since, similarly to MgO, CaO is characterized by suppressing the increase in coefficient of thermal expansion without causing a significant decrease in strain point and also provides an improvement in meltability. However, it is not preferable that the CaO content be excessively high, because an excess amount of CaO may lead to poor devitrification resistance, increase in coefficient of thermal expansion, or decrease in acid resistance. In the glass of the present invention, the CaO content is preferably 15.0 mol % or less, more preferably 12.0 mol % or less, even more preferably 10.0 mol % or less, and particularly preferably 9.3 mol % or less. The CaO content is preferably 1.0 mol % or more, more preferably 2.0 mol % or more, even more preferably 3.0 mol % or more, and particularly preferably 3.5 mol % or more.

(9) SrO

Similarly to MgO and CaO, SrO is characterized by suppressing the increase in coefficient of thermal expansion without causing a significant decrease in strain point and also provides an improvement in meltability. SrO may be incorporated in the glass to improve the devitrification resistance and acid resistance. However, it is not preferable that the SrO content be excessively high, because an excess amount of SrO may lead to poor devitrification resistance, increase in coefficient of thermal expansion, decrease in acid resistance, or decrease in durability. In the glass of the present invention, the SrO content is preferably 15.0 mol % or less, more preferably 12.0 mol % or less, even more preferably 10.0 mol % or less, and particularly preferably 9.3 mol % or less. The SrO content is preferably 1.0 mol % or more, more preferably 2.0 mol % or more, even more preferably 3.0 mol % or more, and particularly preferably 3.5 mol % or more.

(10) BaO

BaO may be incorporated in an appropriate amount in the glass, since BaO contributes to adjustment of the etchability of the glass and has the effect of improving the phase separation stability, devitrification resistance, and chemical durability of the glass. In the glass of the present invention, the BaO content is preferably 15.0 mol % or less, more preferably 12.0 mol % or less, even more preferably 10.0 mol % or less, and particularly preferably 6.0 mol % or less. The BaO content is preferably 1.0 mol % or more, more preferably 2.0 mol % or more, even more preferably 3.0 mol % or more, and particularly preferably 3.5 mol % or more. It should be noted that the glass may be substantially free of BaO depending on the balance with the other alkaline-earth metal oxides. Being "substantially free of" BaO means that the BaO content in the glass is less than 0.1 mol %, preferably less than 0.05 mol %, and more preferably 0.01 mol % or less.

(11) MgO+CaO+SrO+BaO

The alkaline-earth metal oxides (MgO, CaO, SrO, and BaO) have the effects as described above; namely, all of them are components that contribute to adjustment of the glass melting temperature while suppressing the increase in coefficient of thermal expansion. The alkaline-earth metal oxides are used for adjustment of the viscosity, melting temperature, and devitrification behavior. However, if the contents of the alkaline-earth metal oxides in a glass are excessively high, the glass may be prone to devitrification. Thus, the total content of the alkaline-earth metal oxides in the glass of the present invention is preferably 25.0 mol % or less, more preferably 23.0 mol % or less, even more preferably 20.0 mol % or less, and particularly preferably 18.0 mol % or less. The total content of the alkaline-earth metal oxides is preferably 6.0 mol % or more, more preferably 8.0 mol % or more, even more preferably 10.0 mol % or more, and particularly preferably 10.5 mol % or more.

(12) $Li_2O$, $Na_2O$, and $K_2O$

Alkali metal oxides ($Li_2O$, $Na_2O$, and $K_2O$) are components that can greatly alter the properties of glasses. These alkali metal oxides may be incorporated in a glass since they significantly increase the meltability of the glass; however, they have a large influence, in particular, on the increase in coefficient of thermal expansion, and their content therefore needs to be adjusted according to the intended use of the glass. In particular, when the alkali metal oxides are contained in a glass for use in the electronic engineering field, they may diffuse into an adjacent semiconductor during post-heating or may significantly deteriorate the electrical insulation properties and adversely affect the dielectric constant ($\in$) or dielectric loss tangent (tan δ) or degrade the high-frequency characteristics. When these alkali metal oxides are contained in a glass, the shaping of the glass may be followed by coating the surface of the shaped glass with another dielectric material. This can prevent at least diffusion of the alkali components over the glass surface, thus eliminating some of the above problems. The coating can be effectively accomplished by a known method, examples of which include: a physical method such as sputtering or vapor-deposition of a dielectric material such as $SiO_2$; and a film formation method that uses a sol-gel process to form a film from a liquid phase. The glass of the present invention may be an alkali-free glass containing no alkali metal oxide ($Li_2O+Na_2O+K_2O=0$ mol %) or may be a low-alkali glass which can contain a slight amount of alkali component. The content of the alkali metal oxide(s) in the low-alkali glass is preferably less than 2.0 mol % and may be less than 1.0 mol %. The content of the alkali metal oxide(s) in the low-alkali glass is more preferably less than 0.1 mol %, even more preferably less than 0.05 mol %, and particularly preferably less than 0.01 mol %. The content of the alkali metal oxide(s) in the low-alkali glass may be 0.0001 mol % or more, 0.0005 mol % or more, or 0.001 mol % or more.

(13) Coloring Component

In the present invention, the "coloring component" refers to a metal oxide that exerts a large coloring effect when incorporated in the glass. Specifically, the coloring component is an oxide of a metal selected from the group consisting of Fe, Ce, Bi, W, Mo, Co, Mn, Cr, V, and Cu. One of such metal oxides or a plurality (two or more) thereof may be incorporated. These metal oxides are believed to have the function of enabling the glass to directly or indirectly absorb the energy of ultraviolet laser beams so that the energy of the laser beams contributes to formation of modified portions in the glass.

As previously described, the coloring component may be added in combination with Ti which is also responsible for absorption. The content of the above-mentioned elements or oxides thereof can be adjusted so that the absorption coefficient α of the glass at a predetermined wavelength (wavelength of 535 nm or less) falls within the range of 1 to 50/cm and more preferably falls within the range of 3 to 40/cm. In Example 1 and Example 2 described later, the values of the absorption coefficient α are 28.2/cm and 4.4/cm, respectively.

(13-1) $CeO_2$ $CeO_2$ may be incorporated as a coloring component. In particular, combined use of $CeO_2$ with $TiO_2$ makes it easier to form modified portions and also allows the modified portion formation to be achieved with reduced variation in quality. However, when the glass of the present invention contains $Fe_2O_3$, the glass may be substantially free of $CeO_2$ (which means that the $CeO_2$ content is 0.04 mol % or less, preferably 0.01 mol % or less, and more preferably 0.005 mol % or less). Addition of an excess amount of $CeO_2$ leads to an increase in the degree of coloring of the glass, thus making difficult the formation of deep modified portions. In the glass of the present invention, the $CeO_2$ content is 0 to 3.0 mol %, preferably 0.05 to 2.5 mol %, more preferably 0.1 to 2.0 mol %, and even more preferably 0.2 to 0.9 mol %. $CeO_2$ is also effective as a refining agent, and its content can be adjusted according to need.

When the glass of the present invention contains $CeO_2$ (except when the $CeO_2$ content is 0.04 mol % or less), a value ("$TiO_2/CeO_2$") obtained by dividing the $TiO_2$ content (mol %) by the $CeO_2$ content (mol %) is preferably 1.0 or more, more preferably 1.5 or more, and even more preferably 2.0 or more to achieve good smoothness of inner walls of holes to be formed through laser irradiation, although the preferred value may vary depending on the balance with the other components. The value $TiO_2/CeO_2$ is preferably 120 or less, more preferably 50.0 or less, even more preferably 35.0 or less, still even more preferably 15.0 or less, and particularly preferably 12.0 or less.

(13-2) $Fe_2O_3$ $Fe_2O_3$ is also effective as a coloring component in the glass according to the present invention and may be incorporated in the glass. In particular, combined use of $TiO_2$ and $Fe_2O_3$ or combined use of $TiO_2$, $CeO_2$, and $Fe_2O_3$ makes easier the formation of modified portions. When the glass of the present invention contains $CeO_2$, the glass may be substantially free of $Fe_2O_3$ (which means that the $Fe_2O_3$ content is 0.007 mol % or less, preferably 0.005 mol % or less, and more preferably 0.001 mol % or less). The appropriate content of $Fe_2O_3$ is 0 to 1.0 mol %, and the $Fe_2O_3$ content is preferably 0.008 to 0.7 mol %, more preferably 0.01 to 0.4 mol %, and even more preferably 0.02 to 0.3 mol %.

When the glass of the present invention contains $Fe_2O_3$ (except when the $Fe_2O_3$ content is 0.007 mol % or less), a value ("$TiO_2/Fe_2O_3$") obtained by dividing the $TiO_2$ content (mol %) by the $Fe_2O_3$ content (mol %) is preferably 1.0 or more, more preferably 1.5 or more, and even more preferably 2.0 or more to achieve good smoothness of inner walls of holes to be formed through laser irradiation, although the preferred value may vary depending on the balance with the other components. The value $TiO_2/Fe_2O_3$ is preferably 700 or less, more preferably 500 or less, even more preferably 200 or less, and particularly preferably 160 or less.

(13-3) Oxides of Metals Such as Bi, W, Mo, Co, Mn, Cr, V, and Cu

As previously described, oxides of metals such as Bi, W, Mo, Co, Mn, Cr, V, and Cu are effective as coloring components and are preferably added so that the absorption coefficient α of the glass falls within the range of 1 to 50/cm and more preferably falls within the range of 3 to 40/cm.

(14) Additional Intermediate Oxides

Known examples of intermediate oxides other than $Al_2O_3$, $TiO_2$, and ZnO (which may hereinafter be referred to as "additional intermediate oxides) include oxides of metals such as Bi, W, Mo, V, Cu, Ga, Se, Zr, Nb, Sb, Te, Ta, Cd, Tl, and Pb. It is suggested that when these intermediate oxides are incorporated in an appropriate amount in a glass, they constitute a part of the glass network and allow modified portions to be formed by laser irradiation at a specific wavelength and to be more easily removed by the subsequent etching, although the glass is desirably as free of Cd, Tl, and Pb as possible because Cd, Tl, and Pb have high toxicity and environmental impact. One of the additional intermediate oxides or a plurality (two or more) thereof may be incorporated in the glass. Oxides of Bi, W, Mo, V, and Cu may act as colorants as previously described, and their contents need to be determined so that the absorption coefficient of the glass produced falls within the desired range. Compositions and evaluation results of glasses containing an appropriate amount of at least one additional intermediate oxide selected from the group consisting of $ZrO_2$, $Ta_2O$, and $Nb_2O_5$ are particularly shown in Table 7. An oxide that can act both as an additional intermediate oxide and as a coloring component is considered herein to be a coloring component.

(14-1) $ZrO_2$

Similarly to $TiO_2$, $ZrO_2$ can be incorporated in the glass according to the present invention as an optional component that can act as an intermediate oxide and constitute a part of the glass network. In addition, $ZrO_2$ is expected to provide a decrease in strain point or an improvement in weather resistance without causing an increase in viscosity at high temperatures. However, increasing the $ZrO_2$ content decreases the devitrification resistance. Thus, the $ZrO_2$ content is preferably 7.0 mol % or less, more preferably 5.0 mol % or less, and even more preferably 3.0 mol % or less. The $ZrO_2$ content is preferably 0.1 mol % or more, more preferably 0.5 mol % or more, and even more preferably 1.0 mol % or more.

(14-2) $Ta_2O_5$ $Ta_2O_5$ can also be incorporated in the glass according to the present invention as an optional component that acts as an intermediate oxide. $Ta_2O_5$ further has the effect of increasing the chemical durability of the glass. However, incorporation of $Ta_2O_5$ causes an increase in specific gravity. Thus, the $Ta_2O_5$ content is preferably 7.0 mol % or less, more preferably 5.0 mol % or less, and even more preferably 3.0 mol % or less. The $Ta_2O_5$ content is preferably 0.1 mol % or more, more preferably 0.5 mol % or more, and even more preferably 1.0 mol % or more.

(14-3) $Nb_2O_5$ $Nb_2O_5$ can also be incorporated in the glass according to the present invention as an optional component that acts as an intermediate oxide. However, increasing the amount of $Nb_2O_5$ which is a rare-earth oxide leads to high material cost. Increasing the amount of $Nb_2O_5$ also causes a decrease in devitrification resistance or an increase in specific gravity. Thus, the $Nb_2O_5$ content is preferably 7.0 mol % or less, more preferably 5.0 mol % or less, and even more preferably 3.0 mol % or less. The $Nb_2O_5$ content is preferably 0.1 mol % or more, more preferably 0.5 mol % or more, and even more preferably 1.0 mol % or more.

(15) Refractive Index Modifying Component

To adjust the refractive index of a glass, for example, an appropriate amount of La oxide or Bi oxide may be incorporated as a refractive index modifying component in the glass. Examples of the La oxide include $La_2O_3$. Examples of the Bi oxide include $Bi_2O_3$, which has been described above as an intermediate oxide. These oxides may be used alone or in combination. Compositions and evaluation results of glasses containing an appropriate amount of a refractive index modifying component are shown in Table 7. $La_2O_3$ can be incorporated in the glass according to the present invention as an optional component having the effect of increasing the refractive index of the glass. However, increasing the amount of $La_2O_3$ which is a rare-earth oxide leads to high material cost. Increasing the amount of $La_2O_3$ also causes a decrease in devitrification resistance. Thus, the $La_2O_3$ content is preferably 7.0 mol % or less, more preferably 5.0 mol % or less, and even more preferably 3.0 mol % or less. The $La_2O_3$ content is preferably 0.1 mol % or more, more preferably 0.5 mol % or more, and even more preferably 1.0 mol % or more. $Bi_2O_3$ can be incorporated in the glass according to the present invention as an optional component having the effect of increasing the refractive index of the glass. The $Bi_2O_3$ content is preferably 7.0 mol % or less, more preferably 5.0 mol % or less, and even more preferably 3.0 mol % or less. The $Bi_2O_3$ content is preferably 0.1 mol % or more, more preferably 0.5 mol % or more, and even more preferably 1.0 mol % or more.

(16) Other Components

Methods available for producing glasses include a float process, a rollout process, a fusion process, a slot down-draw process, a casting process, and a pressing process. For production of glasses for use as substrates in the electronics field, the fusion process is suitable since this process can yield glass substrates both principal surfaces of which have high quality. When a glass is melted and shaped, for example, by the fusion process, a refining agent may be added.

(16-1) Refining Agent

Examples of the refining agent include, but are not limited to: oxides of As, Sb, Sn, and Ce; sulfides of Ba and Ca; chlorides of Na and K; F; $F_2$; Cl; $Cl_2$; and $SO_3$. The glass of the present invention can contain 0 to 3.0 mol % (the case of 0 mol % may be excluded) of at least one refining agent selected from the group consisting of: oxides of As, Sb, Sn, and Ce; sulfides of Ba and Ca; chlorides of Na and K; F; $F_2$; Cl; $Cl_2$; and $SO_3$. $Fe_2O_3$ can also function as a refining agent; however, $Fe_2O_3$ is categorized herein as a coloring component.

(16-2) Impurities Derived from Glass Production Equipment

During glass production, impurities derived from glass production equipment may mingle in glasses. The scope of the glass of the present invention is not particularly limited as long as the effect of the present invention is obtained, and encompasses glasses containing such impurities. Examples of the impurities derived from glass production equipment include Zr and Pt (both of them are main materials of refractory members or electrodes of glass production equipment (including a melting section and a shaping section), and Zr may be used in the form of $ZrO_2$ as a main material of refractory members). Thus, the glass of the present invention may contain a slight amount (for example, 3.0 mol % or less) of at least one species selected from the group consisting of $ZrO_2$ and Pt. As previously described, $ZrO_2$ can be incorporated as an intermediate oxide in the glass. Even when $ZrO_2$ is not intentionally incorporated in the glass, a sight amount of Zr component as an impurity derived from glass production equipment may be contained in the glass as described above.

(16-3) Water

A shaped glass may contain a certain amount of water. One measure indicating the water content is β-OH value. The β-OH value is determined as follows: For a glass substrate having a thickness of t' (mm), a transmittance $T_1$(%) at 3846 $cm^{-1}$ which is a reference wavenumber and a minimum transmittance $T_2$ (%) at around 3600 $cm^{-1}$ which is a hydroxyl absorption wavenumber are measured by FT-IR, and the β-OH value is calculated by the following equation: β-OH value=(1/t')×log($T_1$/$T_2$). The β-OH value may be about 0.01 to 0.5/mm. Decreasing this value contributes to an increase in strain point. However, if this value is excessively small, the meltability tends to be low.

A preferred embodiment (X-1) of the present invention is, for example, an aluminoborosilicate glass including a metal oxide serving as a coloring component, the glass having a glass composition including, in mol %:
45.0%≤$SiO_2$≤66.0%;
7.0%≤$B_2O_3$≤17.0%;
7.0%≤$Al_2O_3$≤13.0%;
0.5%≤$TiO_2$≤4.0%; and
0%≤ZnO≤9.0%, wherein
the following relationships are satisfied:
58.0%≤$SiO_2$+$B_2O_3$≤76.0%;
6.0%≤MgO+CaO+SrO+BaO≤25.0%; and
0≤$Li_2O$+$Na_2O$+$K_2O$<2.0%, and
the metal oxide serving as a coloring component includes, in mol % relative to the glass composition:
(I) 0.01%≤$Fe_2O_3$≤0.4%;
(II) 0.1%≤$CeO_2$≤2.0%; or
(III) 0.01%≤$Fe_2O_3$≤0.4% and 0.1%≤$CeO_2$≤2.0%.

Another preferred embodiment (X-2) of the present invention is, for example, an aluminoborosilicate glass including a metal oxide serving as a coloring component, the glass having a glass composition including, in mol %:
45.0%≤$SiO_2$≤66.0%;
7.0%≤$B_2O_3$≤17.0%;
7.0%≤$Al_2O_3$≤13.0%;
0.5%≤$TiO_2$≤4.0%; and
1.0%≤ZnO≤8.0%, wherein
the following relationships are satisfied:
58.0%≤$SiO_2$+$B_2O_3$≤76.0%;
6.0%≤MgO+CaO+SrO+BaO≤25.0%; and
0≤$Li_2O$+$Na_2O$+$K_2O$<2.0%, and
the metal oxide serving as a coloring component includes, in mol % relative to the glass composition:
(I) 0.01%≤$Fe_2O_3$≤0.4%;
(II) 0.1%≤$CeO_2$≤2.0%; or
(III) 0.01%≤$Fe_2O_3$≤0.4% and 0.1%≤$CeO_2$≤2.0%.

The embodiment (X-1) may be an aluminoborosilicate glass (X-3) in which the glass composition further includes, in mol %:
2.0%≤MgO≤10.0%;
1.0%≤CaO≤10.0%;
1.0%≤SrO≤10.0%; and
0%≤BaO≤6.0%.

The embodiment (X-2) may be an aluminoborosilicate glass (X-4) in which the respective contents of MgO, CaO, SrO, and BaO are identical to those in (X-3).

The embodiment (X-1) may be an aluminoborosilicate glass (X-5) in which the glass composition further includes, in mol %:
3.0%≤MgO≤10.0%;
2.0%≤CaO≤10.0%;
2.0%≤SrO≤10.0%; and
0%≤BaO≤6.0%.

The embodiment (X-2) may be an aluminoborosilicate glass (X-6) in which the respective contents of MgO, CaO, SrO, and BaO are identical to those in (X-5).

For any of the above embodiments (X-1) to (X-6), adjustment of the contents of the components, and addition or omission of some of the components can be done on the basis of the foregoing description. For any of the above embodiments, the glass composition and the values of the various properties (such as the coefficient of thermal expansion and absorption coefficient α) may be adjusted and combined as appropriate. For example, in the glasses according to the embodiments (X-1) to (X-6), the coefficient of thermal expansion may be 60×$10^{-7}$/° C. or less. In the glasses according to the embodiments (X-1) to (X-6), the absorption coefficient α may be 3 to 40/cm.

Another embodiment of the present invention is a method for producing a perforated glass using the above-described glass for laser processing. The production method will be described hereinafter.

The method for producing a perforated glass includes the steps of: [i] irradiating an area of any one of the above glasses for laser processing according to the present invention with a laser pulse focused by a lens, thereby forming a modified portion in the irradiated area; and [ii] etching at least the modified portion using an etchant, thereby forming a hole in the glass for laser processing.

The glass for laser processing used in the step [i] of forming a modified portion can be produced, for example, as follows.

[Melting and Shaping of Glass]

A given amount of glass raw material powder is prepared so that about 300 g of glass will be obtained. The glass raw material powder is formed into a glass block having a certain volume by a common melt extraction method using a platinum crucible. In the course of this process, stirring may be performed for the purpose of homogenization or refining of the glass.

The melting temperature and melting time can be set appropriately depending on the melting properties of the glass. The melting temperature may be, for example, around 800 to 1800° C. or around 1000 to 1700° C. The melting time may be, for example, around 0.1 to 24 hours. To reduce the residual stress within the glass, it is preferable that the glass be allowed to go through a predetermined temperature range (for example, around 400 to 600° C.) over several hours and then be left to cool to room temperature.

The above shaping process can result in a glass substrate for laser processing which is in the form of a thin sheet with a thickness of around 0.1 to 1.5 mm.

[Formation of Modified Portion]

In the step [i], areas of any one of the above glasses for laser processing according to the present invention are irradiated with laser pulses focused by a lens, and thus modified portions are formed in the irradiated areas.

In the step [i], a modified portion can be formed by a single irradiation with a laser pulse. Thus, in the step [i], modified portions can be formed by applying laser pulses in such a manner that irradiation spots do not overlap each other. It should be understood, however, that the laser pulses may be applied in such a manner that the applied pulses overlap each other.

Typically, in the step [i], laser pulses are focused by a lens on points within the glass. For example, when through holes are formed in a glass sheet, laser pulses are typically focused on points at or in the vicinity of the thickness center of the glass sheet. When only the upper portion (portion in the vicinity of the laser pulse incident surface) of a glass sheet is to be processed, laser pulses are typically focused on points in the upper portion of the glass sheet. When only the lower portion (portion remote from the laser pulse incident surface) of the glass sheet is to be processed, laser pulses are typically focused on points in the lower portion of the glass sheet. It should be understood, however, that laser pulses may be focused on points outside the glass as long as modified portions can be formed in the glass. For example, laser pulses may be focused on points located outside the glass sheet at a predetermined distance (for example, 1.0 mm) from the upper surface or lower surface of the glass sheet. That is, as long as modified portions can be formed in the glass, laser pulses may be focused on points within a distance of 1.0 mm from the upper surface of the glass (the points including those on the upper surface of the glass) in an upward direction (the direction opposite to the traveling direction of the laser pulses), the laser pulses may be focused on points within a distance of 1.0 mm from the lower surface of the glass (the points including those on the lower surface of the glass) in a downward direction (the direction in which the laser pulses having passed through the glass travel), or the laser pulses may be focused on points within the glass.

The pulse width of the laser pulses is preferably 1 to 200 nanoseconds (ns), more preferably 1 to 100 ns, and even more preferably 5 to 50 ns. If the pulse width is greater than 200 ns, the peak value of the laser pulses may be decreased so that the processing ends in failure. Laser beams having an energy of 5 to 100 μJ/pulse are applied to the above glass for laser processing. Increasing the energy of the laser pulses leads to a corresponding increase in the length of the modified portions. The beam quality parameter $M^2$ of the laser pulses may be, for example, 2 or less. The use of laser pulses having a parameter $M^2$ of 2 or less makes it easy to form minute holes or minute grooves.

In the production method of the present invention, the laser pulses may be harmonic beams from a Nd:YAG laser, harmonic beams from a Nd:YVO$_4$ laser, or harmonic beams from a Nd:YLF laser. The harmonic beams are, for example, second harmonic beams, third harmonic beams, or fourth harmonic beams. The wavelength of the second harmonic laser beams is around 532 nm to 535 nm. The wavelength of the third harmonic beams is around 355 nm to 357 nm. The wavelength of the fourth harmonic beams is around 266 nm to 268 nm. The use of such laser beams allows for inexpensive processing of the glass.

Exemplary apparatuses used for the laser processing include AVIA 355-4500, a high-repetition-rate, solid-state pulsed UV laser manufactured by Coherent Japan, Inc. This apparatus is a Nd:YVO$_4$ laser that emits third harmonic beams, and outputs a maximum laser power of around 6 W at a repetition frequency of 25 kHz. The wavelength of the third harmonic beams is 350 nm to 360 nm.

The wavelength of the laser pulses is preferably 535 nm or less and may be, for example, in the range of 350 nm to 360 nm. If the wavelength of the laser pulses is more than 535 nm, the spot size is increased so that formation of minute holes is difficult and, in addition, cracks are likely to occur due to heat around the irradiated spots.

An optical system typically used is one in which an oscillated laser beam is expanded by a factor of 2 to 4 by a beam expander (the beam diameter is 7.0 to 14.0 mm at this moment), the central portion of the laser beam is cut by a variable iris, then the optical axis of the beam is adjusted by a galvanometer mirror, and finally the beam is focused on/in the glass with the focal point being adjusted by a fi lens with a focal length of around 100 mm.

The focal length L (mm) of the lens is, for example, in the range of 50 to 500 mm and may be selected from the range of 100 to 200 mm.

The beam diameter D (mm) of the laser pulses is, for example, in the range of 1 to 40 mm and may be selected from the range of 3 to 20 mm. The beam diameter D as defined herein refers to the beam diameter of the laser pulse incident on the lens, and refers to the diameter at which the beam intensity drops to $[1/e^2]$ times the beam intensity at the center of the beam.

In the present invention, a value obtained by dividing the focal length L by the beam diameter D, namely, the value of [L/D], is 7 or more. The value of [L/D] is preferably 7 or more and 40 or less, and may be 10 or more and 20 or less. This value is associated with the degree of focusing of the laser with which the glass is to be irradiated. The smaller the value is, the more localized the laser focusing is, so the more difficult it is to form long, uniform modified portions. If this value is less than 7, the laser power may be so excessively high in the vicinity of the beam waist that cracks are likely to occur within the glass.

In the present invention, it is unnecessary, before laser pulse irradiation of the glass, to subject the glass to a pretreatment (such as formation of a film for promoting the absorption of the laser pulses). However, such a pretreatment may be carried out as long as the effect of the present invention is obtained.

The numerical aperture (NA) may be varied in the range of 0.020 to 0.075 by changing the size of the iris and thus adjusting the laser beam diameter. If the NA is excessively large, the laser energy is concentrated only at and around the focal points, which leads to a failure to form effective modified portions in the thickness direction of the glass.

The use of pulsed laser beams having a small NA for irradiation allows a single irradiation to form modified portions that are relatively long in the thickness direction of the glass, and is therefore effective in shortening the tact time.

In laser irradiation of a sample, the repetition frequency is preferably 10 to 25 kHz. The positions of modified portions to be formed in the glass can be optimally adjusted (toward the upper surface or lower surface) by shifting the focal points in the thickness direction of the glass.

Furthermore, the output power of the laser, the operation of the galvanometer mirror, etc., can be controlled by a controlling PC. The laser can be applied to a glass substrate at a predetermined speed on the basis of two-dimensional graphic data created, for example, by a CAD software.

In a laser-irradiated area of the glass there is formed a modified portion distinguished from the rest of the glass. This modified portion can easily be identified, for example, with the aid of an optical microscope. The shape of the modified portion formed is generally cylindrical, although the shape may vary depending on the glass composition. The modified portion extends from the vicinity of the upper surface of the glass to the vicinity of the lower surface.

This modified portion is thought to be a portion with a defect such as E' center or non-bridging oxygen which has resulted from photochemical reaction induced by laser irradiation or a portion with a sparse glass structure generated at a high temperature due to rapid heating during laser irradiation and maintained due to rapid cooling after laser irradiation. This modified portion can be etched by a specific etchant at a higher rate than the rest of the glass; thus, immersing the glass in the etchant can result in a minute hole or groove in the modified portion.

In conventional processing methods using a femtosecond laser (which is generally expensive), laser beams are scanned in a depth direction (the thickness direction of a glass substrate) during formation of modified portions so that the applied pulses overlap each other. In the hole forming technique (the method for producing a perforated glass) according to the present invention which uses a combination of laser irradiation and wet etching, modified portions can be formed by a single irradiation with laser pulses.

The conditions employed in the step [i] are, for example, as follows: the absorption coefficient $\alpha$ of the glass is 1 to 50/cm, the pulse width of the laser pulses is 1 to 100 ns, the energy of the laser pulses is 5 to 100 µJ/pulse, the wavelength of the laser pulses is 350 nm to 360 nm, and the beam diameter D of the laser pulses is 3 to 20 mm, and the focal length L of the lens is 100 to 200 mm.

Before the step [ii], the glass sheet may, if desired, be polished to reduce the variation in diameter of the modified portions. However, excessive polishing may reduce the effect of etching on the modified portions. The depth of polishing is preferably 1 to 20 µm from the upper surface of the glass sheet.

The size of the modified portions formed in the step [i] varies depending on the beam diameter D of the laser pulses incident on the lens, the focal length L of the lens, the absorption coefficient $\alpha$ of the glass, and the power of the laser pulses. The diameter of the resulting modified portions is, for example, around 5 to 200 µm and may be around 10 to 150 µm. The depth of the modified portions may be, for example, around 50 to 300 µm, although the depth may vary depending on the laser irradiation conditions, the absorption coefficient $\alpha$ of the glass, and the thickness of the glass.

[Etching]

In the step [ii], at least the modified portions are etched using an etchant to form holes in the glass for laser processing.

It is preferable that the etchant used in the step [ii] should etch the modified portions at an etching rate higher than an etching rate at which the etchant etches the rest of the glass for laser processing. The etchant used may be, for example, hydrofluoric acid (aqueous solution of hydrogen fluoride (HF)). Alternatively, sulfuric acid ($H_2SO_4$), an aqueous solution of $H_2SO_4$, nitric acid ($HNO_3$), an aqueous solution of $HNO_3$, or hydrochloric acid (aqueous solution of hydrogen chloride (HCl)) may be used. These acids may be used alone, or a mixture of two or more of these acids may be used. When hydrofluoric acid is used as the etchant, the etching of the modified portions readily proceeds, and thus holes can be quickly formed. When sulfuric acid is used as the etchant, the areas of the glass other than the modified portions are slow to be etched, and thus straight holes with a small tapered angle can be formed.

In the etching step, the upper surface or lower surface of the glass sheet may be coated and protected with a surface protection coating agent to allow the etching to proceed from only one of the surfaces. The surface protection coating agent used can be a commercially-available product, an example of which is SILITECT-II (manufactured by Trylaner International).

The etching time and the etchant temperature are selected according to the shape of the modified portions or the desired shape to be obtained by the etching process. Raising the temperature of the etchant used in the etching can increase the etching rate. The diameter of the holes can be controlled by the etching conditions.

The etching time is preferably, but not limited to, around 30 to 180 minutes, although the etching time may vary depending on the thickness of the glass. The etchant temperature can be varied to adjust the etching rate, and is preferably around 5° C. to 45° C. and more preferably around 15 to 40° C.

The etching process can be accomplished even when the etchant temperature is 45° C. or higher. However, such a high etchant temperature is not practical since the etchant quickly evaporates. The etching process can be accomplished even when the etchant temperature is 5° C. or lower. However, a low etchant temperature leading to an extremely low etching rate is not practical.

During the etching, ultrasonic waves may be applied to the etchant if desired. The application of ultrasonic waves can increase the etching rate and is also expected to produce a stirring effect on the etchant.

When the modified portions are formed to be exposed only at the upper surface (the laser pulse incident surface) of the glass sheet, holes can be formed only in the upper portion of the glass sheet by the etching. When the modified portions are formed to be exposed only at the lower surface (the surface opposite to the laser pulse incident surface) of the glass sheet, holes can be formed only in the lower portion of the glass sheet by the etching. When the modified portions are formed to be exposed at the upper and lower surfaces of the glass sheet, through holes can be formed by the etching. A film for inhibiting etching may be formed on the upper or lower surface of the glass sheet to allow the etching to proceed from only one of the surfaces. It is also conceivable to form modified portions not exposed at either of the surfaces of the glass sheet, then grind the glass sheet to expose the modified portions, and then perform the etching. Changing the conditions of the formation of the modified portions and the conditions of the etching makes it possible to form holes of various shapes, such as through holes of cylindrical shape, through holes of one-sheet hyperboloidal shape (hourglass shape), through holes of frustoconical shape, holes of conical shape, holes of frustoconical shape, and holes of cylindrical shape.

Holes can be formed to connect with each other so that a groove is formed. In this case, laser pulses are applied in an aligned manner to form modified portions arranged in a line. After that, the modified portions are etched to form the groove. The spots to which the laser pulses are applied need not overlap each other, and holes formed as a result of the etching may connect neighboring holes to each other.

FIG. 1 shows schematic diagrams illustrating an embodiment of the production method of the present invention. As shown in FIG. 1A, laser pulses 11 are applied to a glass sheet 12, and thus modified portions 13 penetrating through the glass sheet 12 are formed. Next, etching is allowed to proceed from both surfaces of the glass sheet 12, and thus through holes 14 are formed. In FIG. 1B, the through holes 14 have a shape made up of two connected frustoconical holes.

As described above, the holes formed by the method of the present invention may be blind holes or through holes.

In the step [ii], the removal of the modified portions by etching may be stopped at the moment when holes are partially connected. This can result in, for example, a groove whose width periodically varies. The variation in width need not be periodic, and a groove having a localized narrow portion may be formed by adjusting the distance between the modified portions to be formed. Thus, according to the present invention, a glass sheet with a groove having a localized narrow portion can be obtained. This groove has a segment (portion) narrower than the rest of the groove when viewed in a direction perpendicular to the surfaces of the etched glass sheet. The narrower segment connects adjacent wider segments. The wider segments result from etching of modified portions formed by laser pulse irradiation.

The present invention encompasses embodiments obtainable by combining the above features in a various way within the technical scope of the present invention as long as the embodiments provide the effect of the present invention.

EXAMPLES

Hereinafter, the present invention will be described in more detail by way of examples. The present invention is by no means limited by these examples, and many modifications are possible by any ordinarily skilled person in the art within the technical concept of the present invention.

Examples in which glass substrates having different compositions were subjected to hole forming will be described below, along with the description of hole quality evaluations. The hole quality evaluations were made according to the criteria described below. All of the evaluations were made by observation or examination after laser irradiation and completion of perforation by etching. "Good" means a practically acceptable level, while "poor" means an unacceptable level.

(1) Circularity or Contour

Figure 2:
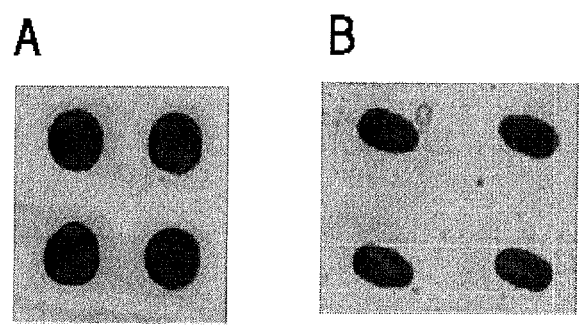
FIG. 2 is a diagram for illustrating a method used in the present invention for evaluation of the circularity or contour of holes.

Openings of approximately circular holes formed in each glass substrate (or in its surface) were evaluated. The glass substrate was rated as "good" if the ratio of the largest diameter to smallest diameter (largest diameter/smallest diameter) was 1.5 or less, and otherwise as "poor". This is because when a glass substrate having holes whose openings are "oblong" is used in an electronic circuit board, the pitches in the electronic circuit board can be unfortunately non-uniform. Examples are shown in FIG. 2. FIG. 2A shows the case of "good", while FIG. 2B shows the case of "poor".

(2) Smoothness of Inner Walls of Holes

Figure 3:
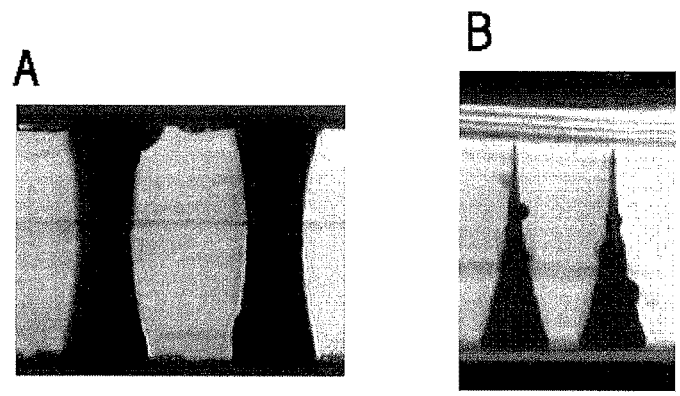
FIG. 3 is a diagram for illustrating a method used in the present invention for evaluation of the flatness of inner walls of holes.

Each glass substrate was cut in a direction parallel to the thickness direction of the glass substrate, and the cross-sections of the holes were inspected with an optical microscope at a magnification of 100 or more. The glass substrate was rated as "good" if the inner walls of the holes were free of visually observable irregularities, and otherwise as "poor". It is necessary for the inner walls of holes formed in a glass substrate to be free of such irregularities when the glass substrate is used as an interposer for an electronic circuit board, since the presence of such irregularities adversely affect the high-frequency characteristics. Examples are shown in FIG. 3. FIG. 3A shows the case of "good", while FIG. 3B shows the case of "poor". When approximately circular figures were only formed on the surface of a glass substrate or when the holes formed in a glass substrate had a depth of less than 0.05 mm, the glass substrate was rated as "-", which means being "not evaluable".

(3) Penetration

Figure 4:
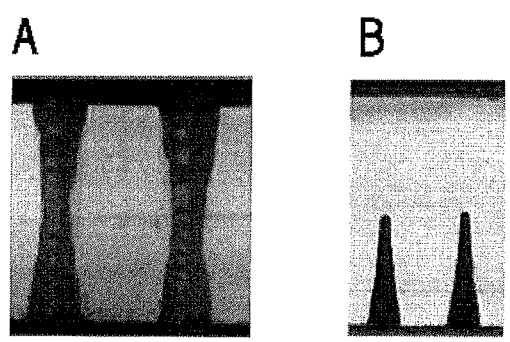
FIG. 4 is a diagram for illustrating a method used in the present invention for evaluation of the depth of holes formed in glasses.

Whether or not the holes penetrated through each glass substrate was also inspected, although the invention does not require such penetration since whether holes penetrate through a glass substrate depends on the thickness of the glass substrate. The holes were classified as "through holes" if they extended through the entire thickness of the glass substrate, and otherwise as "blind holes". The holes classified as "blind holes" were those having a depth similar to or greater than their opening diameter. Examples are shown in FIG. 4. FIG. 4A shows "through" holes, while FIG. 4B shows "blind" holes. The holes classifiable neither as through holes nor as blind holes were rated as "-", which means being "not evaluable".

Glasses rated as "good" in both (1) and (2) are usable as electronic substrates. However, a glass that is usable but can be cracked is practically unacceptable for industrial use.

The coefficient of thermal expansion and absorption coefficient α were evaluated by the following methods.

(4) Coefficient of Thermal Expansion

An average coefficient of thermal expansion in the temperature range of 50 to 350° C. was measured as follows. First, a cylindrical glass sample having a diameter of 5 mm and a height of 18 mm was prepared. This glass sample was heated from 25° C. up to the yield point of the glass sample, the elongation of the glass sample was measured at various temperatures, and the coefficient of thermal expansion was calculated on the basis of the elongation. The average of values of the coefficient of thermal expansion in the temperature range of 50 to 350° C. was calculated to determine the average coefficient of thermal expansion. The measurement was carried out at a temperature rise rate of 5° C./min using TMA 4000 SA, a thermomechanical analyzer manufactured by NETZSCH Japan K.K.

(5) Absorption Coefficient α

The absorption coefficient α was calculated by measuring the transmittance and reflectance of a glass substrate having a thickness of t (cm). For the glass substrate having a thickness of t (cm), the transmittance T (%) and the reflectance R (%) at an incident angle of 12° were measured at a predetermined wavelength (wavelength of 535 nm or less) using a spectrophotometer (V-670, an ultraviolet/visible/near-infrared spectrophotometer manufactured by JASCO Corporation). The absorption coefficient α was calculated from the measured values using the following equation.

$$\alpha = (1/t) * \ln\{(100-R)/T\}$$

Examples 1 to 32 and Comparative Examples 1 to 6

[Melting and Shaping of Glass]

Given amounts of glass raw material powders were prepared so that glasses having the compositions shown in Tables 1 to 3 and 7 below would be obtained in an amount of about 300 g. Each glass raw material powder was formed into a glass block having a certain volume by a common melt extraction method using a platinum crucible. In the course of this process, stirring was performed for the purpose of homogenization or refining of the glass.

The melting temperature and melting time were set appropriately depending on the melting properties of the glasses. For example, in Example 1, the glass was melted at about 1600° C. for 6 hours, after which the molten glass was cast onto a carbon plate and thus shaped. To reduce the residual stress within the glass, the glass was allowed to go through the temperature range of 550° C. to 700° C. including the annealing point over about 4 hours, after which the glass was left to cool to room temperature.

A thin glass substrate having a thickness of around 0.1 to 1.5 mm was cut from the glass block formed as above, and used as a sample for modified portion formation.

[Formation of Modified Portion]

Laser processing was performed using AVIA 355-4500, a high-repetition-rate, solid-state pulsed UV laser manufactured by Coherent Japan, Inc. This laser is a Nd:YVO$_4$ laser that emits third harmonic beams, and outputs a maximum laser power of around 6 W at a repetition frequency of 25 kHz. The dominant wavelength of the third harmonic beams is 355 nm.

Laser pulses (having a pulse width of 9 ns, a power of 0.8 W, and a beam diameter of 3.5 mm) emitted from the laser were expanded by a factor of 4 by a beam expander, and the expanded beams were cut by a variable iris whose diameter can be varied in the range of 5 to 15 mm. The optical axes of the beams were adjusted by a galvanometer mirror, and the beams were focused on points within the glass sheet by a fθ lens with a focal length of 100 mm. The NA of the beams was varied in the range of 0.020 to 0.075 by changing the size of the iris and thus adjusting the laser beam diameter. The laser beams were focused on points at a physical distance of 0.15 mm from the upper surface of the glass sheet. The laser beams were scanned at a speed of 400 mm/s in such a manner that the applied pulses did not overlap each other.

After the laser irradiation, it was confirmed by optical microscope observation of each of the glasses of the examples that modified portions distinct from the rest of the glass were formed in the laser-irradiated areas. The modified portions were generally cylindrical, and extended from the vicinity of the upper surface of the glass to the vicinity of the lower surface of the glass, although there were some differences among the glasses.

In the laser irradiation of each sample, the repetition frequency was 10 to 25 kHz. The focal points were shifted in the thickness direction of the glass so that the positions of the modified portions to be formed in the glass were optimally adjusted (toward the upper surface or lower surface).

The glasses for laser processing which were subjected to the processing had different compositions. Thus, the points on which the laser was focused were adjusted for each of the glasses of the examples so that the processing was accomplished under conditions considered to be optimal. The thickness of the glass substrates used was uniformly set to 0.3 mm to examine the difference among the glasses, with the exception of Examples 23 to 32. In addition, glass substrates having different thicknesses ranging from around 0.2 to 1.5 mm were subjected to the processing to examine the thickness dependence of glass quality.

[Etching]

The laser-irradiated sample was etched by introducing the sample into an etchant tank containing an etchant that was a mixture of 2.13 wt % HF (original concentration: 4.5%) and 3.28 wt % HNO$_3$ while stirring the etchant. The etching time was varied between 90 to 120 minutes depending on the sample thickness, and the etchant temperature was set to 33° C.

TABLE 1

|  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| SiO$_2$ | 64.1 | 56.88 | 56.5 | 56.4 | 56.4 | 56.4 | 58.84 | 59.5 | 58.88 | 54.88 | 52.88 |
| B$_2$O$_3$ | 9.5 | 7.5 | 7.5 | 7.5 | 7.5 | 7.5 | 7.5 | 7.5 | 7.5 | 7.5 | 7.5 |
| Al$_2$O$_3$ | 9.0 | 11.0 | 11.0 | 11.0 | 11.0 | 11.0 | 11.0 | 11.0 | 11.0 | 11.0 | 11.0 |
| TiO$_2$ | 3.0 | 3.0 | 3.0 | 3.0 | 3.0 | 3.0 | 1.0 | 0.2 | 3.0 | 3.0 | 3.0 |
| Na$_2$O | 0.0 | 0.0 | 0.0 | 0.0 | 0.0 | 0.0 | 0.0 | 0.0 | 0.0 | 0.0 | 0.0 |
| ZnO | 3.0 | 3.0 | 3.0 | 3.0 | 3.0 | 3.0 | 3.0 | 3.0 | 1.0 | 5.0 | 7.0 |
| MgO | 4.6 | 7.8 | 7.8 | 9.3 | 4.7 | 4.7 | 7.8 | 7.8 | 7.8 | 7.8 | 7.8 |
| CaO | 3.2 | 5.4 | 5.4 | 4.7 | 9.3 | 4.7 | 5.4 | 5.4 | 5.4 | 5.4 | 5.4 |
| SrO | 3.2 | 5.4 | 5.4 | 4.7 | 4.7 | 9.3 | 5.4 | 5.4 | 5.4 | 5.4 | 5.4 |
| BaO | 0.0 | 0.0 | 0.0 | 0.0 | 0.0 | 0.0 | 0.0 | 0.0 | 0.0 | 0.0 | 0.0 |
| Fe$_2$O$_3$ | 0.00 | 0.02 | 0.00 | 0.00 | 0.00 | 0.00 | 0.06 | 0.20 | 0.02 | 0.02 | 0.02 |
| CeO$_2$ | 0.4 | 0.0 | 0.4 | 0.4 | 0.4 | 0.4 | 0.0 | 0.0 | 0.0 | 0.0 | 0.0 |

TABLE 1-continued

|  | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| Thickness (mm) | 0.3 | 0.3 | 0.3 | 0.3 | 0.3 | 0.3 | 0.3 | 0.3 | 0.3 | 0.3 | 0.3 |
| Absorption coefficient α (/cm) | 28.2 | 4.4 | — | — | — | — | — | — | — | — | — |
| Coefficient of thermal expansion (×$10^{-7}$/° C.) | — | 45 | — | — | — | — | — | — | — | — | — |

TABLE 2

|  | Example 12 | Example 13 | Example 14 | Example 15 | Example 16 | Example 17 | Example 18 | Example 19 | Example 20 | Example 21 | Example 22 |
|---|---|---|---|---|---|---|---|---|---|---|---|
| $SiO_2$ | 62.98 | 62.98 | 48.5 | 64.6 | 50.0 | 65.4 | 64.3 | 56.68 | 56.88 | 56.88 | 63.1 |
| $B_2O_3$ | 7.5 | 7.5 | 16.4 | 10.5 | 9.5 | 9.5 | 9.5 | 7.5 | 7.5 | 7.5 | 9.5 |
| $Al_2O_3$ | 11.0 | 11.0 | 10.0 | 7.5 | 11.0 | 9.0 | 9.0 | 11.0 | 11.0 | 11.0 | 9.0 |
| $TiO_2$ | 3.0 | 3.0 | 3.0 | 3.0 | 3.0 | 1.5 | 3.0 | 3.0 | 3.0 | 3.0 | 3.0 |
| $Na_2O$ | 0.0 | 0.0 | 0.0 | 0.0 | 0.0 | 0.0 | 0.0 | 0.0 | 0.0 | 0.0 | 1.0 |
| ZnO | 0.0 | 0.0 | 3.0 | 3.0 | 3.0 | 3.0 | 3.0 | 3.0 | 3.0 | 3.0 | 3.0 |
| MgO | 6.5 | 9.5 | 9.3 | 4.6 | 9.5 | 4.6 | 4.6 | 7.8 | 6.6 | 8.6 | 4.6 |
| CaO | 4.5 | 3.0 | 4.7 | 3.2 | 6.8 | 3.2 | 3.2 | 5.4 | 4.0 | 4.0 | 3.2 |
| SrO | 4.5 | 3.0 | 4.7 | 3.2 | 6.8 | 3.2 | 3.2 | 5.4 | 4.0 | 4.0 | 3.2 |
| BaO | 0.0 | 0.0 | 0.0 | 0.0 | 0.0 | 0.0 | 0.0 | 0.0 | 4.0 | 2.0 | 0.0 |
| $Fe_2O_3$ | 0.02 | 0.02 | 0.00 | 0.00 | 0.00 | 0.00 | 0.00 | 0.02 | 0.02 | 0.02 | 0.00 |
| $CeO_2$ | 0.0 | 0.0 | 0.4 | 0.4 | 0.4 | 0.6 | 0.2 | 0.2 | 0.0 | 0.0 | 0.4 |
| Thickness (mm) | 0.3 | 0.3 | 0.3 | 0.3 | 0.3 | 0.3 | 0.3 | 0.3 | 0.3 | 0.3 | 0.3 |
| Absorption coefficient α (/cm) | — | — | — | — | — | — | — | — | — | — | — |
| Coefficient of thermal expansion (×$10^{-7}$/° C.) | 36 | 35 | — | — | — | — | — | — | — | — | — |

TABLE 3

|  | Example 23 | Example 24 | Example 25 | Example 26 | Comparative Example 1 | Comparative Example 2 | Comparative Example 3 | Comparative Example 4 | Comparative Example 5 | Comparative Example 6 |
|---|---|---|---|---|---|---|---|---|---|---|
| $SiO_2$ | 56.88 | 56.88 | 56.88 | 56.88 | 60.0 | 58.0 | 60.98 | 60.92 | 62.1 | 60.1 |
| $B_2O_3$ | 7.5 | 7.5 | 7.5 | 7.5 | 7.5 | 7.5 | 7.5 | 7.5 | 9.5 | 9.5 |
| $Al_2O_3$ | 11.0 | 11.0 | 11.0 | 11.0 | 11.0 | 11.0 | 11.0 | 11.0 | 9.0 | 9.0 |
| $TiO_2$ | 3.0 | 3.0 | 3.0 | 3.0 | 3.0 | 3.0 | 0.0 | 0.0 | 5.0 | 7.0 |
| $Na_2O$ | 0.0 | 0.0 | 0.0 | 0.0 | 0.0 | 0.0 | 0.0 | 0.0 | 0.0 | 0.0 |
| ZnO | 3.0 | 3.0 | 3.0 | 3.0 | 3.0 | 5.0 | 5.0 | 5.0 | 3.0 | 3.0 |
| MgO | 7.8 | 7.8 | 7.8 | 7.8 | 9.5 | 6.5 | 6.5 | 6.5 | 4.6 | 4.6 |
| CaO | 5.4 | 5.4 | 5.4 | 5.4 | 3.0 | 4.5 | 4.5 | 4.5 | 3.2 | 3.2 |
| SrO | 5.4 | 5.4 | 5.4 | 5.4 | 3.0 | 4.5 | 4.5 | 4.5 | 3.2 | 3.2 |
| BaO | 0.0 | 0.0 | 0.0 | 0.0 | 0.0 | 0.0 | 0.0 | 0.0 | 0.0 | 0.0 |
| $Fe_2O_3$ | 0.02 | 0.02 | 0.02 | 0.02 | 0.00 | 0.00 | 0.02 | 0.08 | 0.00 | 0.00 |
| $CeO_2$ | 0.0 | 0.0 | 0.0 | 0.0 | 0.0 | 0.0 | 0.0 | 0.0 | 0.4 | 0.4 |
| Thickness (mm) | 0.5 | 0.7 | 1.0 | 1.5 | 0.3 | 0.3 | 0.3 | 0.3 | 0.3 | 0.3 |
| Absorption coefficient α (/cm) | 4.4 | 4.4 | 4.4 | 4.4 | — | — | — | — | 80.2 | 102.5 |
| Coefficient of thermal expansion (×$10^{-7}$/° C.) | 45 | 45 | 45 | 45 | — | — | — | — | — | — |

TABLE 4

| | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|
| (1) Circularity or contour | Good | Good | Good | Good | Good | Good | Good | Good | Good | Good | Good |
| (2) Smoothness of inner walls of holes | Good | Good | Good | Good | Good | Good | Good | Good | Good | Good | Good |
| (3) Penetration | Through holes | Through holes | Through holes | Through holes | Through holes | Through holes | Through holes | Through holes | Through holes | Through holes | Through holes |

TABLE 5

| | Example 12 | Example 13 | Example 14 | Example 15 | Example 16 | Example 17 | Example 18 | Example 19 | Example 20 | Example 21 | Example 22 |
|---|---|---|---|---|---|---|---|---|---|---|---|
| (1) Circularity or contour | Good | Good | Good | Good | Good | Good | Good | Good | Good | Good | Good |
| (2) Smoothness of inner walls of holes | Good | Good | Good | Good | Good | Good | Good | Good | Good | Good | Good |
| (3) Penetration | Blind holes | Blind holes | Through holes | Through holes | Through holes | Through holes | Through holes | Through holes | Through holes | Through holes | Through holes |

TABLE 6

| | Example 23 | Example 24 | Example 25 | Example 26 | Comparative Example 1 | Comparative Example 2 | Comparative Example 3 | Comparative Example 4 | Comparative Example 5 | Comparative Example 6 |
|---|---|---|---|---|---|---|---|---|---|---|
| (1) Circularity or contour | Good | Good | Good | Good | Good | Good (Cracks occurred) | Good | Good | Good | Good |
| (2) Smoothness of inner walls of holes | Good | Good | Good | Good | — | — | Poor | Poor | Poor | Poor |
| (3) Penetration | Through holes | Through holes | Through holes | Blind holes | — | Blind holes | Blind holes | — | — | — |

TABLE 7

| | Example 27 | Example 28 | Example 29 | Example 30 | Example 31 | Example 32 |
|---|---|---|---|---|---|---|
| $SiO_2$ | 53.88 | 53.88 | 53.88 | 53.88 | 53.88 | 56.86 |
| $B_2O_3$ | 7.5 | 7.5 | 7.5 | 7.5 | 7.5 | 7.5 |
| $Al_2O_3$ | 11.0 | 11.0 | 11.0 | 11.0 | 11.0 | 11.0 |
| $TiO_2$ | 3.0 | 3.0 | 3.0 | 3.0 | 3.0 | 3.0 |
| $Na_2O$ | 0.0 | 0.0 | 0.0 | 0.0 | 0.0 | 0.0 |
| ZnO | 3.0 | 3.0 | 3.0 | 3.0 | 3.0 | 3.0 |
| MgO | 7.8 | 7.8 | 7.8 | 7.8 | 7.8 | 7.8 |
| CaO | 5.4 | 5.4 | 5.4 | 5.4 | 5.4 | 5.4 |
| SrO | 5.4 | 5.4 | 5.4 | 5.4 | 5.4 | 5.4 |
| BaO | 0.0 | 0.0 | 0.0 | 0.0 | 0.0 | 0.0 |
| $Fe_2O_3$ | 0.02 | 0.02 | 0.02 | 0.02 | 0.02 | 0.04 |
| $CeO_2$ | 0.0 | 0.0 | 0.0 | 0.0 | 0.0 | 0.0 |
| $ZrO_2$ | 3.0 | 0.0 | 0.0 | 0.0 | 0.0 | 0.0 |
| $Ta_2O_5$ | 0.0 | 3.0 | 0.0 | 0.0 | 0.0 | 0.0 |
| $Nb_2O_5$ | 0.0 | 0.0 | 3.0 | 0.0 | 0.0 | 0.0 |
| $La_2O_3$ | 0.0 | 0.0 | 0.0 | 3.0 | 0.0 | 0.0 |
| $Bi_2O_3$ | 0.0 | 0.0 | 0.0 | 0.0 | 3.0 | 0.0 |
| Thickness (mm) | 0.2 | 0.2 | 0.2 | 0.2 | 0.2 | 0.2 |
| Absorption coefficient α (/cm) | — | — | — | — | — | — |

TABLE 7-continued

|  | Example 27 | Example 28 | Example 29 | Example 30 | Example 31 | Example 32 |
|---|---|---|---|---|---|---|
| Coefficient of thermal expansion ($\times 10^{-7}/°$ C.) | — | — | — | — | — | — |
| (1) Circularity or contour | Good | Good | Good | Good | Good | Good |
| (2) Smoothness of inner walls of holes | Good | Good | Good | Good | Good | Good |
| (3) Penetration | Through holes | Through holes | Through holes | Through holes | Through holes | Through holes |

As demonstrated by Examples 1 to 32, the holes were successfully formed in the glasses, according to the present invention, in the presence of a coloring component and an appropriate amount of $TiO_2$. As shown in Tables 1 to 3 and 7, the glasses of Examples 1 to 32 were alkali-free glasses, with the exception of the glass of Example 22. It was confirmed in all Examples that the glass substrate was thinned by several tens of micrometers as a result of etching and that holes having a diameter of 50 to 100 μm and a depth of around 0.15 to 0.3 mm were formed in the etched glass substrate. In particular, in Examples 12, 13, and 26, holes having good appearance were observed in the glass surface, although they were not through holes.

The above results verified that the glass for laser processing according to the present invention allows holes with a circular contour and a smooth inner wall to be formed therein by a collective micro-hole-forming process using a combination of modified portion formation by ultraviolet laser irradiation and etching.

The glass for laser processing according to the present invention which has undergone the hole forming process is suitable for use as a glass substrate for an interposer, as a glass substrate for mounting of electronic parts, or as a glass substrate for mounting of optical elements. An interposer is a substrate that interconnects a pair of circuit boards differing in terminal pitch such as a pair of an IC and a printed board that differ in routing design rule.

A glass substrate for an interposer which can be produced from the glass for laser processing according to the present invention is well compatible, in terms of coefficient of thermal expansion, with Si substrates which may be used in combination with the glass substrate. Furthermore, by virtue of containing no or very little alkali metal component, the glass substrate has significantly advantageous electrical characteristics such as being resistant to deterioration at high frequencies. In addition, unlike Si substrates, the glass substrate for an interposer which can be produced from the glass for laser processing according to the present invention is distinctively characterized by being optically transparent in the visible to near-infrared region. This allows a photoelectric conversion element mounted on the substrate to supply light through the substrate or receive light through the substrate. Thus, a multiple board having both an optical element and an electric circuit can easily be fabricated.

Figure 5:
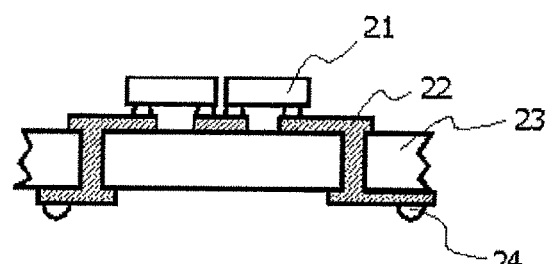
FIG. 5 is a diagram for illustrating an example (a glass substrate for an interposer) in which the glass for laser processing according to the present invention is used.

FIG. 5 shows a schematic example of a glass substrate 23 for an interposer which can be produced from the glass for laser processing according to the present invention. The interposer shown as an example in this figure is an interposer used to join a light emitting/receiving element 21 such as an IC and a printed circuit board which differ from each other in routing design rule such as in wiring pitch.

A circuit pattern 22 or an electrode 24 is formed on one or both sides of the glass for laser processing according to the present invention after hole forming of the glass. The formation of the circuit pattern 22 or electrode 24 can be accomplished by a known technique, a specific example of which is, but not limited to, patterning using a combination of electroless plating and electrolytic plating. The material of the circuit and electrode is preferably, but not limited to, Au or Cu, since these metals have a low electrical resistance and provide good high-frequency characteristics.

In the formation of such a circuit pattern, through holes at certain locations may be filled with Au or Cu. This can ensure electrical conductivity between the two sides of the glass. The filling can be accomplished simultaneously with plating. The filling may be separately done by a known technique before or after the plating step.

After that, any desired electronic part or light emitting/receiving element can be mounted. Mounting to a desired circuit board can also be easily accomplished.

INDUSTRIAL APPLICABILITY

The glass for laser processing according to the present invention is useful for production of a perforated glass having holes with a circular contour and a smooth inner wall.

The invention claimed is:

1. A glass for laser processing, the glass comprising a metal oxide serving as a coloring component, the glass having a glass composition comprising, in mol %:
   $45.0\% \leq SiO_2 \leq 68.0\%$;
   $2.0\% \leq B_2O_3 \leq 20.0\%$;
   $3.0\% \leq Al_2O_3 \leq 20.0\%$;
   $1.0\% \leq TiO_2 \leq 5.0\%$;
   $1.0\% \leq ZnO \leq 8.0\%$; and
   $3.0\% \leq MgO \leq 10.0\%$;
   wherein the metal oxide serving as a coloring component comprises, in mol % relative to the glass composition:
   $0.01\% \leq Fe_2O_3 \leq 0.4\%$; and
   the following relationships are satisfied:
   $6.0\% \leq MgO+CaO+SrO+BaO \leq 25.0\%$; and
   $0 \leq Li_2O+Na_2O+K_2O < 0.1\%$.

2. The glass for laser processing according to claim 1, wherein the metal oxide serving as a coloring component comprises, in mol % relative to the glass composition:
   $0.02\% \leq Fe_2O_3 \leq 0.4\%$.

3. The glass for laser processing according to claim 1, wherein the metal oxide serving as a coloring component further comprises, in mol % relative to the glass composition:
0.1%≤$CeO_2$≤2.0%.

4. The glass for laser processing according to claim 1, wherein the glass composition comprises, in mol %:
45.0%≤$SiO_2$≤63.0%.

5. The glass for laser processing according to claim 1, wherein the following relationship is satisfied:
55.0%≤$SiO_2$+$B_2O_3$≤72.0%.

6. The glass for laser processing according to claim 1, wherein the glass composition further comprises at least one component selected from the group consisting of $ZrO_2$, $Ta_2O_5$, and $Nb_2O_5$, and
contents of $ZrO_2$, $Ta_2O_5$, and $Nb_2O_5$ are in the following range, in mol %:
0.1%≤$ZrO_2$≤7.0%;
0.1%≤$Ta_2O_5$≤7.0%;
0.1%≤$Nb_2O_5$≤7.0%.

7. The glass for laser processing according to claim 1, further comprising a refractive index modifying component.

8. The glass for laser processing according to claim 7, wherein the refractive index modifying component comprises at least one component selected from the group consisting of $La_2O_3$ and $Bi_2O_3$, and
contents of $La_2O_3$ and $Bi_2O_3$ are in the following range, in mol % relative to the glass composition:
0.1%≤$La_2O_3$≤7.0%; or
0.1%≤$Bi_2O_3$≤7.0%.

9. The glass for laser processing according to claim 1, having a coefficient of thermal expansion of $60 \times 10^{-7}$/° C. or less.

10. The glass for laser processing according to claim 1, having an absorption coefficient α of 3 to 40/cm.

11. A method for producing a perforated glass, comprising:
(i) irradiating an area of the glass for laser processing according to claim 1 with a laser pulse focused by a lens, thereby forming a modified portion in the irradiated area; and
(ii) etching at least the modified portion using an etchant, thereby forming a hole in the glass for laser processing.

12. The glass for laser processing according to claim 1, wherein the glass composition comprises, in mol %:
45.0%≤$SiO_2$≤66.0%;
7.0%≤$B_2O_3$≤17.0%;
7.0%≤$Al_2O_3$≤13.0%;
1.0%≤$TiO_2$≤4.0%;
1.0%≤$ZnO$≤8.0%; and
3.0%≤$MgO$≤10.0%;
wherein the metal oxide serving as a coloring component comprises, in mol % relative to the glass composition:
0.01%≤$Fe_2O_3$≤0.4%; and
the following relationships are satisfied:
58.0%≤$SiO_2$+$B_2O_3$≤76.0%;
6.0%≤$MgO$+$CaO$+$SrO$+$BaO$≤25.0%; and
0≤$Li_2O$+$Na_2O$+$K_2O$≤0.1%.

13. The glass for laser processing according to claim 12, wherein the glass composition further comprises, in mol %:
0%≤$BaO$≤6.0%.

14. The glass for laser processing according to claim 12, wherein the glass composition further comprises, in mol %:
2.0%≤$CaO$≤10.0%;
2.0%≤$SrO$≤10.0%; and
0%≤$BaO$≤6.0%.

15. A glass for laser processing, the glass comprising a metal oxide serving as a coloring component, the glass having a glass composition comprising, in mol %:
45.0%≤$SiO_2$≤68.0%;
2.0%≤$B_2O_3$≤20.0%;
3.0%≤$Al_2O_3$≤20.0%;
1.0%≤$TiO_2$≤5.0%;
1.0%≤$ZnO$≤8.0%; and
3.0%≤$MgO$≤10.0%,
wherein the metal oxide serving as a coloring component comprises, in mol % relative to the glass composition:
0.1%≤$CeO_2$≤2.0%; and
the following relationships are satisfied:
6.0%≤$MgO$+$CaO$+$SrO$+$BaO$≤25.0%; and
0<$Li_2O$+$Na_2O$+$K_2O$<0.1%.

* * * * *